United States Patent
Hauser et al.

[11] Patent Number: 6,111,407
[45] Date of Patent: Aug. 29, 2000

[54] METHOD OF PRODUCING A MAGNETIC FIELD SENSOR, AND SENSOR WITH A SENSOR WIRE PRESS-FITTED INTO SPACED-APART CONDUCTORS

[75] Inventors: Hans Hauser; Johann Nicolics; Herbert Newald, all of Vienna; Horst Bruggraber, Langenwang, all of Austria

[73] Assignee: Securiton General Control Systems Gesellschaft m.b.H., Vienna, Austria

[21] Appl. No.: 09/030,228

[22] Filed: Feb. 25, 1998

[30] Foreign Application Priority Data

Feb. 26, 1997 [AT] Austria ................................. A323/97
Feb. 3, 1998 [AT] Austria ................................. A183/98

[51] Int. Cl.[7] .......................... G01R 33/02; G01R 33/06; H01F 1/153; H01F 4/00; H01F 43/04
[52] U.S. Cl. .......................... 324/260; 324/244; 324/249; 29/595; 29/825; 29/850
[58] Field of Search .................... 324/244, 247, 324/249, 252, 253, 260; 338/32 R; 29/595, 825, 829, 832, 850; 360/110, 113; 235/449

[56] References Cited

U.S. PATENT DOCUMENTS

| | | |
|---|---|---|
| 4,739,263 | 4/1988 | Mohri et al. ............................ 324/247 |
| 5,499,450 | 3/1996 | Jacoby . |
| 5,764,055 | 6/1998 | Kawase ................................... 324/249 |
| 5,811,660 | 9/1998 | Nakano et al. . |
| 5,821,744 | 10/1998 | Shinjo et al. . |
| 5,831,432 | 11/1998 | Mohri ..................................... 324/249 |
| 5,889,403 | 3/1999 | Kawase ................................... 324/249 |

FOREIGN PATENT DOCUMENTS

| | | | |
|---|---|---|---|
| 41 24 684 A1 | 1/1993 | Germany . | |
| 2-271258 | 11/1990 | Japan ..................................... | 324/252 |
| 7-181239 | 7/1995 | Japan ..................................... | 324/260 |

OTHER PUBLICATIONS

Japanese Patent No. 08323479 (Kazumi), dated Dec. 10, 1996.
Japanese Patent No. 08323480 A (Kazumi), dated Dec. 10, 1996.
U.S. application No. 09311169 A (Yasunari et al.), dated Dec. 2, 1997.

*Primary Examiner*—Gerard Strecker
*Attorney, Agent, or Firm*—Herbert L. Lerner; Laurence A. Greenberg; Werner H. Stemer

[57] ABSTRACT

A method of producing a magnetic field sensor, whose sensor element is formed by at least one piece of wire comprising amorphous or nanocrystalline ferromagnetic material, whose electrical impedance is dependent on the magnetic field. The piece of wire is connected by an electrical terminal of nonferromagnetic metal. The ends of the at least one piece of wire are press-fitted into two spaced-apart conductors of nonferromagnetic metal, in particular copper.

19 Claims, 2 Drawing Sheets

METHOD OF PRODUCING A MAGNETIC FIELD SENSOR, AND SENSOR WITH A SENSOR WIRE PRESS-FITTED INTO SPACED-APART CONDUCTORS

BACKGROUND OF THE INVENTION

1. Field of the Invention

The invention relates to a method of producing a magnetic field sensor, whose sensor element is formed by at least one piece of wire comprising amorphous or nanocrystalline ferromagnetic material, whose electrical impedance depends on a magnetic field, the piece of wire being provided with electrically conductive terminals of nonferromagnetic metal. The invention further relates to magnetic field sensors produced by this method.

2. Description of the Related Art

Prior art magnetic field sensors include a piece of wire made of an amorphous, ferromagnetic material, whose electrical impedance is magnetic-field-dependent. Because of this property, it is possible to detect the intensity of a magnetic field by measuring the current flowing through the sensor element. Such magnetic field sensors are used for instance to scan magnetically coded data carriers, which have a plurality of magnetic dipoles located close together. There is a need to be able to detect each of the thus-generated individual magnetic fields separately, so as to be able to pick up the information from the data carrier. Since the individual magnetic fields are thus very close together, there is a need to embody the sensor element with very short lengths, for instance on the order of magnitude of about 100 $\mu$m, so that the desired local resolution can be attained.

In the production of such magnetic field sensors, however, the problem arises that sensor elements made from an amorphous or nanocrystalline wire material with the aforementioned dimensions can be electrically connected by soldering only with difficulty if at all. Magnetic field sensors with very short effective lengths thus cannot be produced by conventional methods.

It has become known from Japanese patent disclosure JP 08-323 479A to connect sensor elements formed of amorphous material to the electrical terminals by means of resistance welding. It is disadvantageous, in that process, that resistance welding destroys or damages the amorphous structure of the sensor elements, thereby destroying or affecting the magnetic field dependency of the sensor elements.

SUMMARY OF THE INVENTION

It is accordingly an object of the invention to provide a method of producing a magnetic field sensor, which overcomes the above-mentioned disadvantages of the prior art devices and methods of this general type and which allows the production of magnetic field sensors with very short effective lengths.

With the foregoing and other objects in view there is provided, in accordance with the invention, an improved method of producing a magnetic field sensor, wherein a sensor element is formed from at least one piece of wire of amorphous or nanocrystalline ferromagnetic material, the electrical impedance of which is magnetic-field-dependent, and the piece of wire is provided with electrical terminals of nonferromagnetic metal. The improvement comprises the step of:

press-fitting the ends of the at least one piece of wire into two spaced-apart electrical conductors of nonferromagnetic metal.

In other words, the objects of the invention are attained in that the ends of the at least one piece of wire are press-fitted into two spaced-apart electrical conductors of nonferromagnetic metal, in particular copper. The spacing between the two conductors from one another defines the effective length of the sensor element.

In accordance with an added feature of the invention, the at least one piece of wire, after being press-fitted into the conductors of nonferromagnetic metal, is additionally joined to the metal by welding, in particular by high-energy beams, such as laser beams. It is also expedient, after the at least one piece of wire is press-fitted into the two electrical conductors, to cut off its ends by means of high-energy beams, especially laser beams, or by severing welding. The reason for this is that these ends can influence the magnetic fields and thereby change the outcome and accuracy of the detection.

In a preferred embodiment, the ends of a straight piece of wire produced from amorphous or nanocrystalline ferromagnetic material are press-fitted into two spaced-apart electrical conductors of nonferromagnetic metal. As an alternative to this, a piece of wire is bent approximately into a U, and its two legs are slipped onto a plate of electrically insulating material, both sides of which are provided with coatings of an electrically conductive nonferromagnetic metal, in particular copper, and press-fitted into the coatings.

By means of both these methods, very short effective lengths of the sensor element can be achieved.

In accordance with again another feature of the invention, the piece of wire produced from amorphous or nanocrystalline ferromagnetic material is embodied in a meandering shape, and its two ends are press-fitted into conductors of nonferromagnetic metal that are electrically separated from one another. The ends of two pieces of wire of ferromagnetic, electrical material, which form an angle with one another, in particular an angle of 90°, can also be press-fitted into spaced-apart conductors of nonferromagnetic metal, in particular copper. As a result, magnetic field sensors are created by which variously oriented magnetic fields can be detected in a linear motion, without changing the angular position of the sensor.

With the above and other objects in view there is also provided a magnetic field sensor produced by the above-noted method. The sensor comprises:

a sensor element formed from at least one piece of wire of amorphous or nanocrystalline ferromagnetic material, the at least one piece of wire having two ends;

the wire having an electrical impedance which depends on a magnetic field; and two spaced-apart electrical conductors of nonferro-magnetic metal, the ends of the at least one piece of wire being press-fitted into the two spaced-apart electrical conductors of nonferromagnetic metal, such as copper.

In accordance with again a further feature of the invention, the piece of wire is substantially U-shaped with two legs, and the conductors are defined by coatings on two sides of an electrically insulating plate, and wherein the two legs are press-fitted into the coatings of the plate.

In accordance with another feature of the invention, the piece of wire has a meandering shape.

In accordance with a concomitant feature of the invention, the at least one piece of wire is one of two pieces of wire of amorphous or nanocrystalline, ferromagnetic material, with ends enclosing a given angle with one another.

Other features which are considered as characteristic for the invention are set forth in the appended claims.

Although the invention is illustrated and described herein as embodied in a method of producing magnetic field sensors and field sensors produced thereby, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
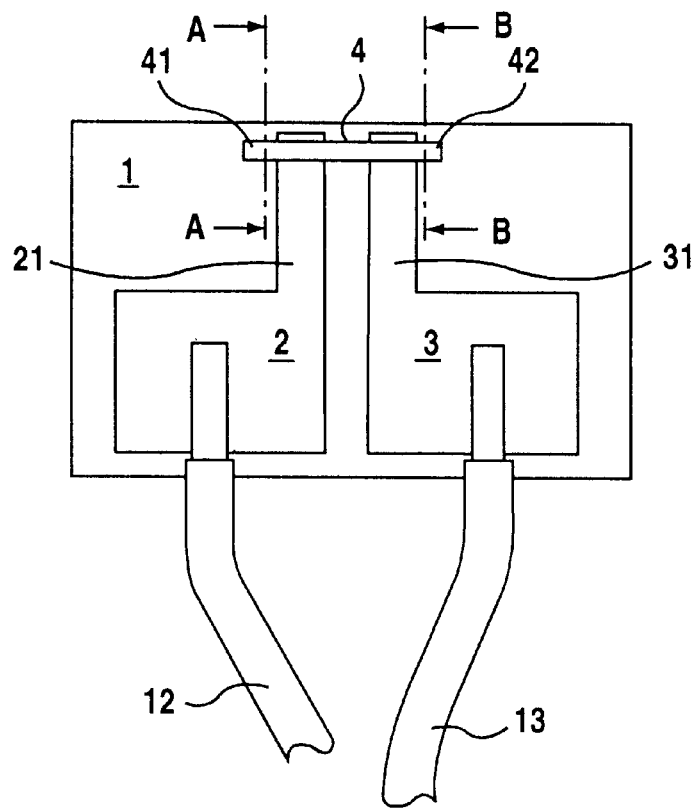
FIG. 1 is a plan view of a magnetic field sensor produced by a first method of the invention.

Referring now to the figures of the drawing in detail and first, particularly, to FIG. 1 thereof, there is seen a plate 1 made from fiber-glass-reinforced epoxy resin, and which has an electrically conductive coating of a nonferromagnetic metal, such as copper, with a thickness of 35 $\mu$m. Two electrically conductive contact faces 2 and 3 are separated from one another, by means of a conventional etching technique. Electrical conductors 12 and 13 are connected to the contact faces 2 and 3 in the usual way, such as by soldering. The contact faces 2 and 3 are embodied with two lugs 21 and 31, which are spaced apart from one another by approximately 100 $\mu$m. A piece of wire 4 made of amorphous or nanocrystalline ferromagnetic material and having a thickness of about 35 $\mu$m is press-fitted into these lugs 21 and 31. As a result, the wire 4 is mechanically and electrically joined to the lugs 21 and 31. Press-fitting is possible because the nonferromagnetic metal is substantially softer than the material from which the piece of wire 4 is made.

Thereafter, the ends 41 and 42 of the piece of wire 4 that protrude past the lugs are cut off along the lines A—A and B—B by laser beam or by sever welding. This is necessary, since these ends affect the magnetic field, which would otherwise render the measurement incorrect. The effective length of the sensor element formed by the piece of wire 4 is determined by the spacing of the two lugs 21 and 31 from one another.

By this method, it is thus possible to produce magnetic field sensors in which the effective lengths of the sensor elements have very slight values, and thus even magnetic fields generated by magnetic dipoles located close together can be detected. High resolution of a magnetically coded data carrier is thereby made possible, for example. With such a magnetic field sensor, it is also possible to detect the rotational angles of gear wheels or stepping motors.

Figure 1A:
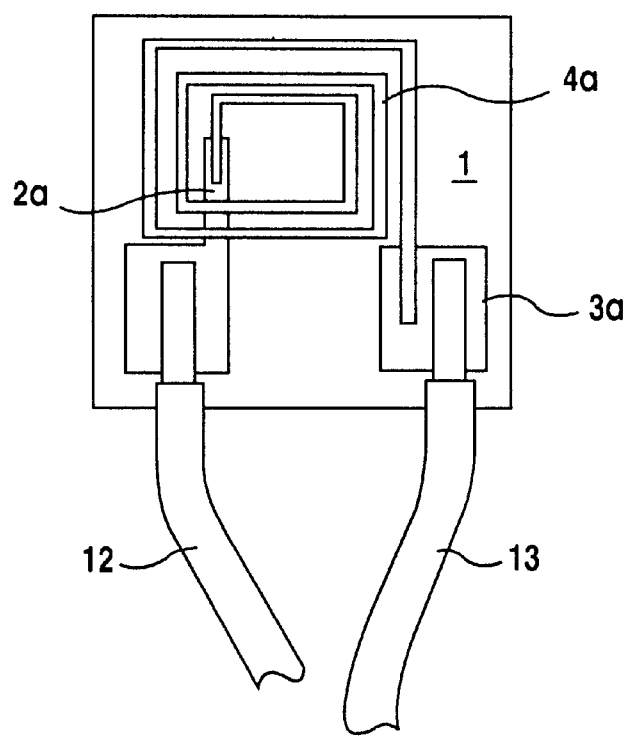
FIG. 1a is a similar view of a magnetic field sensor which is modified relative to the sensor of FIG. 1, yet produced by the first method of the invention.

In FIG. 1a, a magnetic field sensor is shown in which the sensor element has a different embodiment. Once again, electrical contact faces 2a and 3a of non-ferromagnetic metal coatings, especially of copper, are located on a supporting plate 1. Conductors 12 and 13 are soldered to them. The two ends of a meandering sensor element 4a (formed of amorphous or nanocrystalline, ferromagnetic material) are press-fitted into the two contact faces 2a and 3a, thereby joining the ends and the faces mechanically and electrically. One of the terminals, which intersects the sensor element, must be insulated from the sensor element 4a. This configuration of the sensor element 4a increases its effective length multiple times, without thereby increasing the actual length of the sensor element 4a to any appreciable degree. As a result, the sensitivity of the sensor element is increased substantially.

In addition, by means of such a sensor element, variously oriented magnetic fields can be detected by means of a linear motion, without requiring any change in the angular position of the magnetic field sensor. Thus magnetic fields oriented in various directions can be detected when the magnetic field sensor moves in a single direction.

Figure 1B:
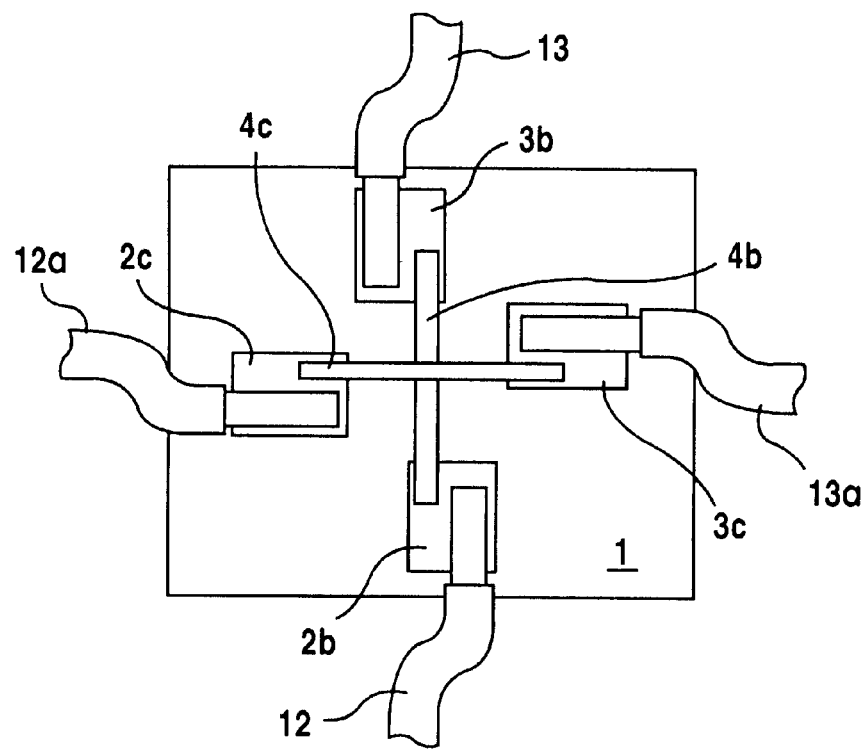
FIG. 1b is a similar view of a further modified magnetic field sensor.

In FIG. 1b, a magnetic field sensor is shown that is embodied with two sensor elements. Here four contact faces 2b, 3b, 2c and 3c of a nonferromagnetic metal coating, in particular copper, are located on a supporting plate 1; the electrical terminal lines 12 and 13 and 12a and 13a are soldered to one side of these faces while on the other, the respective ends of two sensors 4b and 4c, which are made of amorphous or nanocrystalline ferromagnetic material and intersect one another at a right angle, are press-fitted into the contact faces. By means of this kind of magnetic field sensor, directionally independent measurements can also be made, or magnetic fields can be detected in two dimensions.

Figure 2:
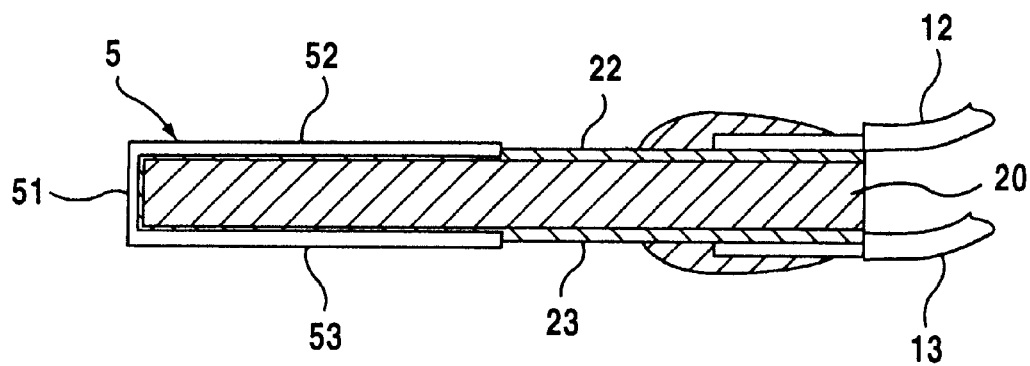
FIG. 2 is a partly sectional view of a magnetic field sensor produced by a second method of the invention.

A second production method for a magnetic field sensor will now be described with reference to FIG. 2:

The plate 20 is formed of an electrically nonconductive material, and it is provided on its top and bottom sides with respective electrically conductive coatings 22 and 23 of a nonferromagnetic electrical metal, such as copper. A substantially U-bent sensor element 5 of amorphous or nanocrystalline ferromagnetic material is placed on the plate in such a way that its two legs 52 and 53 are press-fitted into the coatings 22 and 23. As a result, the sensor element is mechanically and electrically joined to the supporting plate 20. For magnetic fields created by very small magnetic dipoles, the length of the crosspiece 51 of the sensor element determines the length of the dipole, and the effective length of the sensor element is determined by the length of this crosspiece 51.

The press-fitting of the sensor elements, made of amorphous or nanocrystalline ferromagnetic wire material, into the nonferromagnetic contact faces can be effected for instance with a polished platelet of aluminum oxide ceramic.

By cutting off the ends of the pieces of wire press-fitted into the metal contact surfaces by means of high-energy beams or by severing welding, there is thus no attendant damage to the structure of the pieces of wire, since good heat dissipation is effected by means of the terminal faces.

Magnetic field sensors made in this way can also be integrated into electrical circuits.

We claim:

1. An improved method of producing a magnetic field sensor, wherein a sensor element is formed from at least one piece of wire of amorphous or nanocrystalline ferromagnetic material, the electrical impedance of which is magnetic-field-dependent, and the piece of wire is formed with two ends to be connected to electrical terminals of nonferromagnetic metal, the improvement which comprises:

providing two spaced-apart electrical conductors without any press fit channels formed therein, said electrical conductors consisting of nonferromagnetic metal being substantially softer than the at least one piece of wire;

press-fitting the ends of the at least one piece of wire into the electrical conductors.

2. The method according to claim 1, wherein the non-ferromagnetic metal in the press-fitting step is copper.

3. The method according to claim 1, which further comprises, subsequently to the press-fitting step, joining the at least one piece of wire to the nonferromagnetic metal by welding.

4. The method according to claim 3, wherein the joining step comprises welding with a high-energy beam.

5. The method according to claim 3, wherein the joining step comprises welding with a laser beam.

6. The method according to claim 1, which further comprises, subsequently to the press-fitting step, cutting off the ends of the piece of wire with high-energy beams.

7. The method according to claim 6, wherein the cutting step comprises cutting the ends off of the wire with laser beams.

8. The method according to claim 1, which further comprises, subsequently to the press-fitting step, cutting off the ends of the piece of wire with severing welding.

9. The method according to claim 1, wherein the wire is a straight piece of wire press-fitted into the two spaced-apart electrical conductors of nonferromagnetic metal.

10. The method according to claim 1, which further comprises bending the piece of wire substantially into a U-shaped wire with two legs, slipping the two legs onto a plate of electrically insulating material, both sides of which are provided with coatings of an electrically conductive nonferromagnetic metal, and press-fitting the two legs into the coatings of the plate.

11. The method according to claim 1, which further comprises shaping the piece of wire into a meandering shape with two ends, and press-fitting the two ends into conductors of nonferromagnetic material that are electrically separated from one another.

12. The method according to claim 1, which further comprises providing two pieces of wire of amorphous or nanocrystalline, ferromagnetic material, with ends enclosing a given angle with one another, and press-fitting the ends into spaced-apart conductors of nonferromagnetic metal.

13. The method according to claim 12, wherein the nonferromagnetic material in the press-fitting step is copper.

14. The method according to claim 12, wherein the ends of the two pieces of wire enclose an angle of 90°.

15. A magnetic field sensor, comprising:

a sensor element formed from at least one piece of wire of amorphous or nanocrystalline ferromagnetic material, said at least one piece of wire having two ends;

said wire having an electrical impedance which depends on a magnetic field; and two spaced-apart electrical conductors of nonferromagnetic metal being substantially softer than the material of said at least one piece of wire, said ends of said at least one piece of wire being press-fitted into said two spaced-apart electrical conductors of nonferromagnetic metal.

16. The magnetic field sensor according to claim 15, wherein the non-ferromagnetic metal is copper.

17. The magnetic field sensor according to claim 15, wherein said piece of wire is substantially U-shaped with two legs, and wherein said conductors are defined by coatings on two sides of an electrically insulating plate, and wherein said two legs are press-fitted into said coatings on said plate.

18. The magnetic field sensor according to claim 15, wherein said piece of wire has a meandering shape.

19. The magnetic field sensor according to claim 15, wherein said at least one piece of wire is one of two pieces of wire of amorphous or nanocrystalline, ferromagnetic material, with ends enclosing a given angle with one another.

* * * * *